(12) United States Patent
Sankaran et al.

(10) Patent No.: US 6,735,737 B2
(45) Date of Patent: May 11, 2004

(54) ERROR CORRECTION STRUCTURES AND METHODS

(75) Inventors: Jagadeesh Sankaran, Dallas, TX (US); David Hoyle, Glendale, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 442 days.

(21) Appl. No.: 09/788,850

(22) Filed: Feb. 20, 2001

(65) Prior Publication Data

US 2001/0037483 A1 Nov. 1, 2001

Related U.S. Application Data

(60) Provisional application No. 60/183,419, filed on Feb. 18, 2000.

(51) Int. Cl.$^7$ .............................................. H03M 13/00
(52) U.S. Cl. ....................................... 714/782; 714/781
(58) Field of Search ................................. 714/782, 781, 714/753

(56) References Cited

U.S. PATENT DOCUMENTS 4,890,287 A * 12/1989 Johnson et al. ............. 714/753
6,192,497 B1 * 2/2001 Yang et al. ................. 714/781

OTHER PUBLICATIONS

Massey, Shitt–Register Synthesis and BCH Decoding, IEEE Transactions on Information Theory, vol. IT–15, No. 1, Jan. 1969, pp. 122–127.*

* cited by examiner

*Primary Examiner*—Albert Decady
*Assistant Examiner*—Dipakkumar Gandhi
(74) *Attorney, Agent, or Firm*—Carlton H. Hoel; W. James Brady; Frederick J. Telecky, Jr.

(57) ABSTRACT

A parallel Chien search by partitioning of the nonzero elements of a root field and using a parallel Galois multiplier.

2 Claims, 8 Drawing Sheets

ERROR CORRECTION STRUCTURES AND METHODS

CROSS-REFERENCE TO RELATED APPLICATIONS

This application claims priority from provisional application No. 60/183,419, filed Feb. 18, 2000. The following copending applications disclose related subject matter and have a common assignee with this application: Serial No. 60/183,533.

BACKGROUND OF THE INVENTION

The invention relates to electronic devices, and, more particularly, to error correction structures and methods.

Digital communication and storage systems typically include error correction coding in order to overcome errors arising from the transmission or storage medium. Forward error-correction coding (FEC) systems add redundancy to the transmitted signal so that the receiver can detect and correct errors using only the received signal. This eliminates the need for the receiver to send requests for retransmission to the transmitter.

Figure 1:
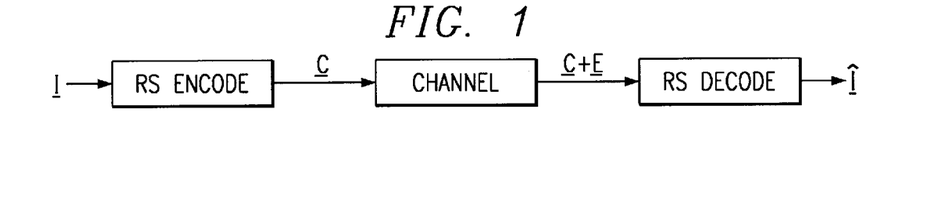
FIGS. 1–2 schematically illustrate FEC coding.
Figure 2:
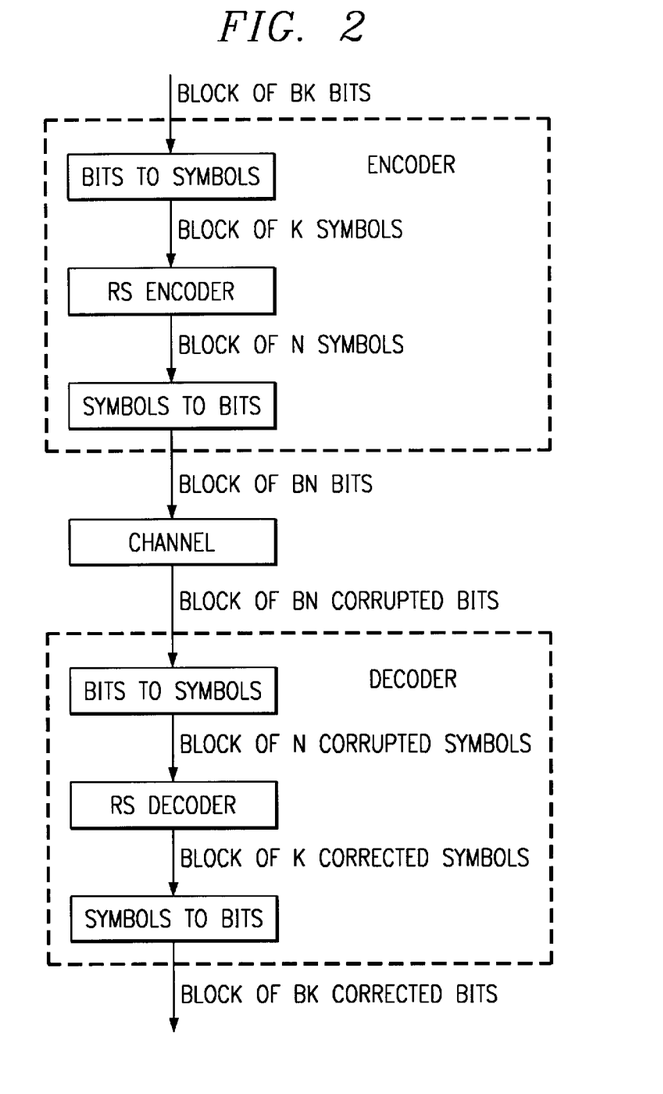

FIGS. 1–2 are high level views of a FEC system. In particular, FIG. 1 shows a block of information symbols, I, transformed into a codeword C which is a larger block that contains both the original information and redundant symbols. After transmission over a channel, the received block of symbols can be represented as C+E where E is a block of error symbols. The decoder generates I' from C+E, and I' will equal I if the number of errors symbols in E is within the correction capabilities of the code.

FIG. 2 shows a more detailed description of the coding. A block of bk information bits is divided into k groups of b bits and each group of b bits represents a symbol, producing a block of k information symbols for coding. The encoder operates on the block of k information symbols to produce a codeword block of n symbols containing the original information in some form as well as redundancy. The code can be designed so that the redundancy is used for error detection only, error correction only, or a combination of some error detection and some error correction. The codeword block of n symbols is then translated into a block of bn bits and transmitted over the channel. The receiver front-end produces a block of bn bits that might be corrupted, depending upon the amount of channel distortion. The block of bn bits is translated into a block of n symbols and processed with the decoder. As long as the transmission errors lead to at most $t=(n-k)/2$ erroneous symbols, a hard-decision decoder can reliably recover the input k information symbols (and thus the input bk bits). The price paid for the added redundancy is the increase in the number of symbols to transmit by a factor of n/k. Of course, this means an information decrease by a factor of k/n for a constant transmission rate.

One of the more popular error correction code types is BCH codes which are cyclic block codes that utilize Galois fields beyond the simplest GF(2) (the usual binary {0,1}) to prescribe code generator polynomials. Indeed, a BCH code uses a minimal degree generator polynomial with roots being a sequence of powers of a primitive element of a Galois field which may be an extension field of the symbol field (codeword components field). This leads to computations involving multiplications of Galois field elements for the usual decoding steps of syndrome calculation, association with error pattern (determine error-locator polynomial and error locations and values), and error correction. Reed-Solomon codes are a subclass of BCH codes with both symbols and generator polynomial roots in the same field $GF(p^m)$. The commonly used field $GF(2^m)$ allows the elements to be represented as m-bit words.

The nonzero elements of a Galois field form a cyclic multiplicative subgroup and can be expressed as powers of a primitive element $\alpha$. That is, the elements of $GF(p^m)$ are $\{0, 1, \alpha, \alpha^2, \ldots, \alpha^q\}$ where the maximum $q=p^m-2$ and $\alpha^{q+1}=1$. Thus the roots of a generator polynomial $G(x)$ for a BCH code could be $\{\alpha, \alpha^2, \ldots, \alpha^{2t}\}$ for a code which can correct t errors per codeword. The generator polynomial thus would be the least common multiple of the polynomials $\phi_j(x)$ for $j=1, 2, \ldots, 2t$ where $\phi_j(x)$ is a minimal polynomial for $\alpha^j$. The special case of the symbol field being the same as the root field (Reed-Solomon codes) implies $\phi_j(x)$ is simply $x-\alpha^j$.

Systematic BCH encoding, as with cyclic codes in general, forms codewords by concatenating the k information symbols with n-k parity symbols which are computed according to $x^{n-k}I(x) \bmod G(x)$. The additional n-k parity symbols contain the redundant information that is used by the receiver to choose the most likely transmitted k information symbols. In particular, with receiver soft decision the n-k parity symbols can be used to correct t error symbols and detect s erased symbols provided 2t+s is at most equal to n-k. Note that values such as n=204 and k=188 with the field $GF(2^8)$ in a Reed-Solomon code is a commonly used (shortened) code for high speed modems. Such a (204, 188) code can correct 8 error symbols per 204-symbol codeword. Similarly, the (200, 192) code can correct 4 errors per 200-symbol codeword.

Figure 3:
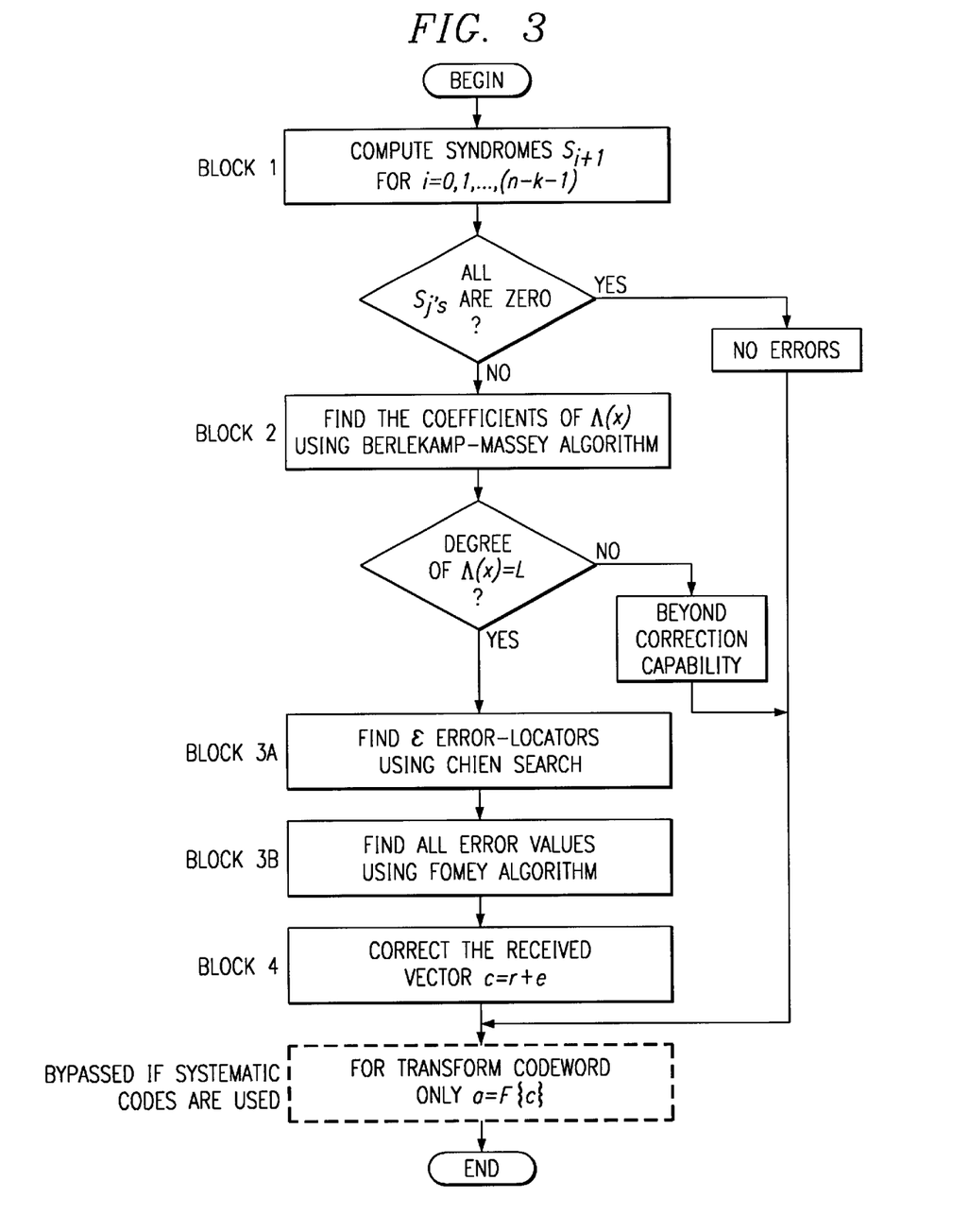
FIG. 3 is a flow for BCH decoding.

FIG. 3 is a flow chart for a commonly-used method of errors-only decoding BCH coded information and which proceeds as follows. Take n−k=2t so that at most t errors can be corrected in a codeword of n symbols. The received polynomial $R(x)=C(x)+E(x)$ where $C(x)$ is the codeword polynomial and $E(x)$ is the error polynomial. $E(x)=\Sigma_j e_j x^j$ with a non-zero $e_j$ the error occurring in the jth position (symbol) of $C(x)$. The decoder is to find the error positions and values to reconstruct $E(x)$ and then recover $C(x)$ as $R(x)-E(x)$. The method first evaluates $R(x)=r_0 x^{n-1}+r_1 x^{n-2}+\ldots+r_{n-1}$ at the 2t roots of the code generator polynomial ($G(x)=\pi_j(x-\alpha^j)$ for Reed-Solomon) and denotes these 2t evaluations as the syndromes $S_0, S_1, S_2, \ldots, S_{2t-1}$. That is, with the roots of $G(x)$ being $\alpha^j$ for $j=0, 1, 2, \ldots, 2t-1$ (which are denoted $\beta_0, \beta_1, \beta_2, \ldots, \beta_{2t-1}$, respectively) the syndromes are (with * denoting Galois field multiplication):

$$S_0 = r_0*\beta_0^{n-1} + r_1*\beta_0^{n-2} + r_2*\beta_0^{n-3} + \ldots + r_{n-2}*\beta_0 + r_{n-1}$$

$$S_1 = r_0*\beta_1^{n-1} + r_1*\beta_1^{n-2} + r_2*\beta_1^{n-3} + \ldots + r_{n-2}*\beta_1 + r_{n-1}$$

$$S_{2t-1} = r_0*\beta_{2t-1}^{n-1} + r_1*\beta_{2t-1}^{n-2} + r_2*\beta_{2t-1}^{n-3} + \ldots + r_{n-2}*\beta_{2t-1} + r_{n-1}$$

Because $C(x)$ is a product of $G(x)$, $C(x)$ vanishes at each of the 2t roots of $G(x)$, and the syndrome $S_j$ equals $E(\beta_j)$. Thus the 2t syndrome equations are nonlinear relations between the 2t syndromes, the at most t error locations, and the at most t error values; that is, 2t nonlinear equations for at most 2t unknowns.

Next, linearize these nonlinear syndrome equations by introduction of the error locator polynomial, $\Lambda(x)=\pi_m(1+X_m x)=1+\Sigma_m \Lambda_m x^m$, where $X_m$ is the mth error location. The error locator polynomial has degree equal to the (not-yet-known) number of errors. That is, $X_m=\alpha^j$ for the mth j for which $e_j$ is nonzero, and the roots of $\Lambda(x)$ are the inverses of the error locations.

Multiplying the defining equation for $\Lambda(x)$ by the error values and powers of the error locations and summing leads to n–k–e linear equations for the e unknowns $\Lambda_j$ with coefficients of these linear equations being an array of the syndromes $S_0$ to $S_{2e-2}$ and the inhomogeneous terms being the sequence of syndromes $S_e$ to $S_{2e-1}$. The number of errors, e, is unknown, so the linear equations cannot be simply solved. Rather, the method of FIG. 3 uses the iterative and inductive Berlekamp-Massey method to find the $\Lambda_j$.

Once the locator polynomial is known, find its roots (the inverses of the error locations) using the Chien search. The Chien search systematically evaluates the locator polynomial $\Lambda(x)$ at all non-zero possible values of the variable and checks for zeros by repeatedly computing $\Lambda(\alpha^j)$ and incrementing j.

Inserting the error locations into the definitions of the syndromes yields simple linear equations for the error values. In fact, the Forney algorithm in FIG. 3 computes the error values without matrix inversion to solve the linear equations. And combining the error values and error locations reconstructs the error polynomial E(x) to subtract from R(x) and lastly recover error-free C(x).

However, efficient computation of the Chien search has problems for systems, especially for systems in which the code (generator polynomial) may change and parallel multiplication is available.

SUMMARY OF THE INVENTION

The present invention provides a BCH code Chien search method with partitioning of the search into subsets for parallel computation with a parallel multiplier.

This has the advantages of full parallel multiplier usage in Chien search.

BRIEF DESCRIPTION OF THE DRAWINGS

The drawings are heuristic for clarity.

FIGS. 5a–6 show preferred embodiment Chien search.

DESCRIPTION OF THE PREFERRED EMBODIMENTS

System Overview

Preferred embodiment Chien searches partition the multiplicative subgroup of the root field GF( ) into subsets and perform parallel simultaneous searches in the subsets and thereby fully load a parallel Galois multiplier. The subsets are conveniently taken as sequences of powers of a primitive element of the root field. Preferred embodiment systems include a digital signal processor with a parallel Galois multiplier, parallel Galois adder (XOR), and memory which implement these Chien searches and other methods to provide realtime decoding of BCH (including Reed-Solomon) coded streams such as used in ADSL communications.

Chien Search Preferred Embodiments

Figure 4A:
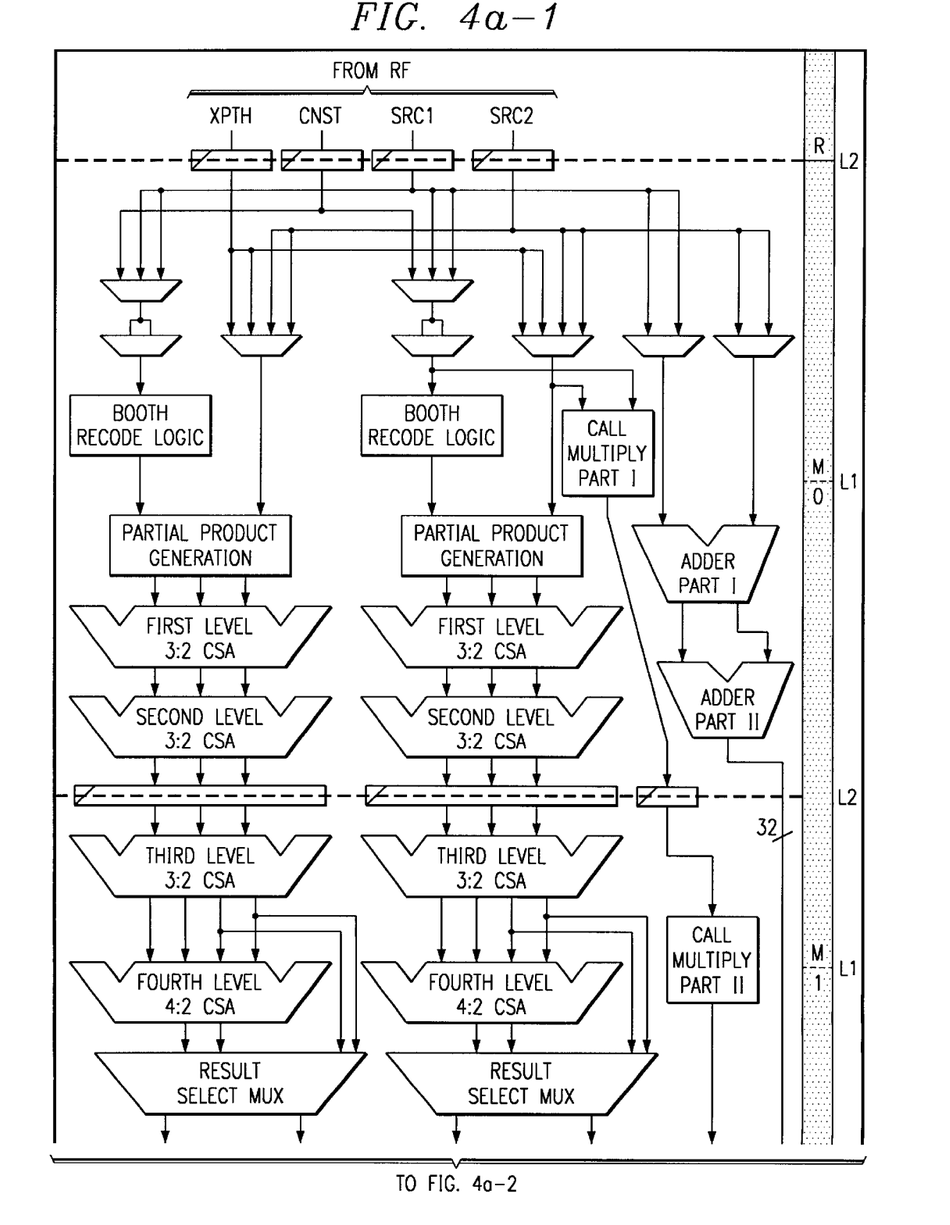
FIGS. 4a–4c show a preferred embodiment Galois multiplier.
Figure 4A:
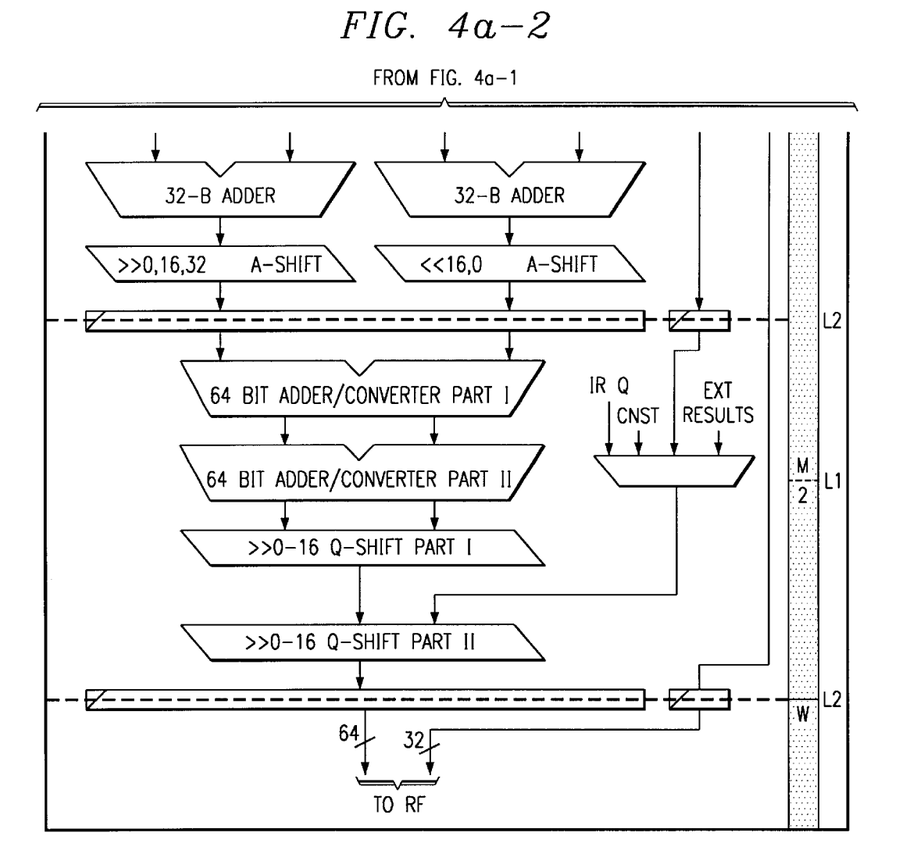
Figure 4B:
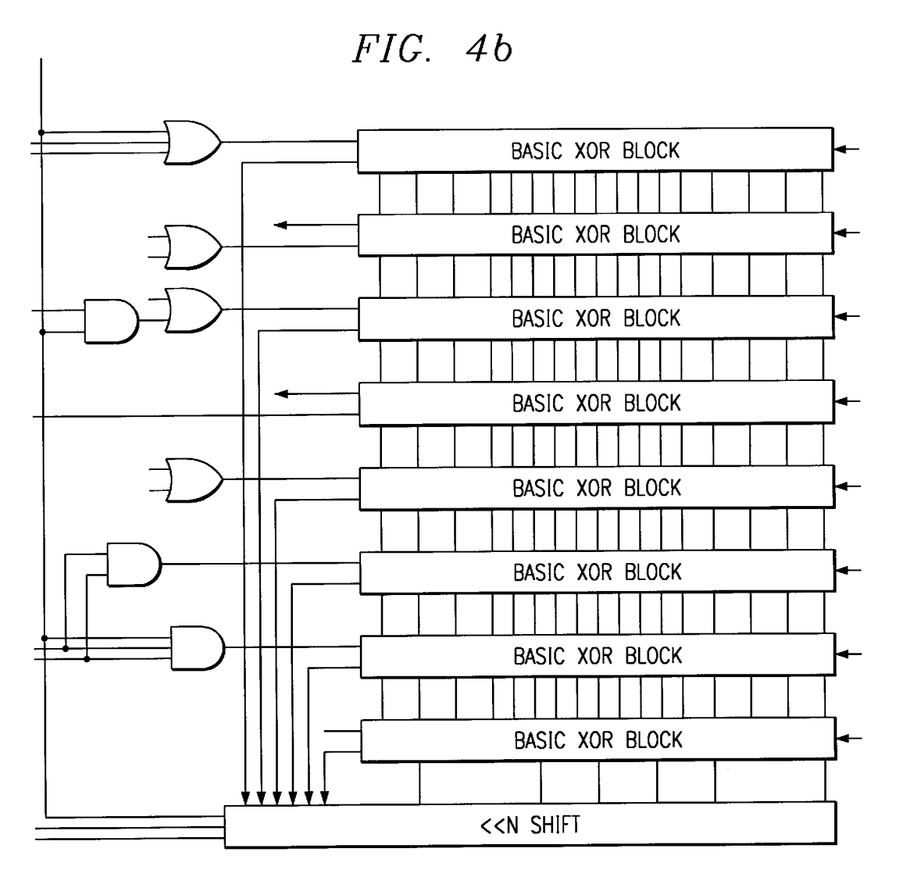
Figure 4C:
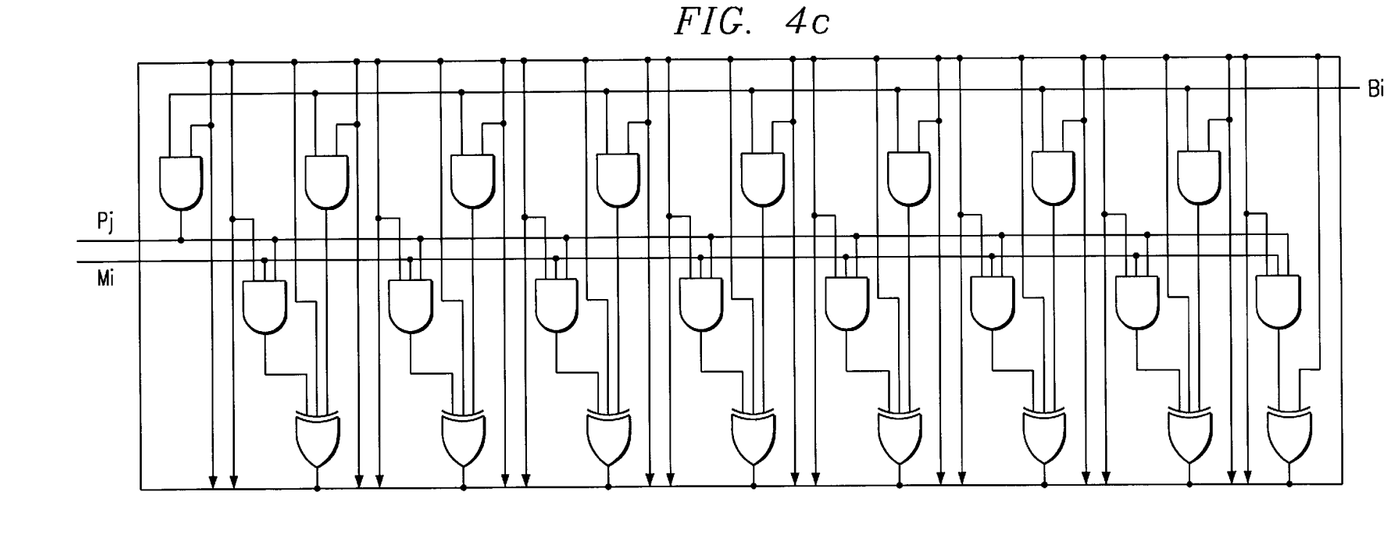

The first preferred embodiments use GF(256) symbols with (n,k) Reed-Solomon codes with n–k=16 and 8, and with n even or odd. The elements of GF(256) can be expressed as 8-bit symbols (bytes). Also, the first preferred embodiments include a 32-bit GF(256) multiplier which can multiply in parallel 4 pairs of GF(256) elements to yield 4 products as illustrated in FIGS. 4a–4c but with a latency of 4 cycles.

Once the error locator polynomial, $\Lambda(x)$, has been found (that is, the coefficients $\Lambda_i$ for i=1, 2, ..., e are found), find the roots of $\Lambda(x)$ by checking if $\Lambda(\alpha^j)=0$ for j=0, 1, 2, ..., 254 to exhaust all possibilities; this is the Chien search. Of course, $\Lambda(0)=\Lambda_0=1$, so 0 is never a root of $\Lambda(x)$.

Figure 5A:
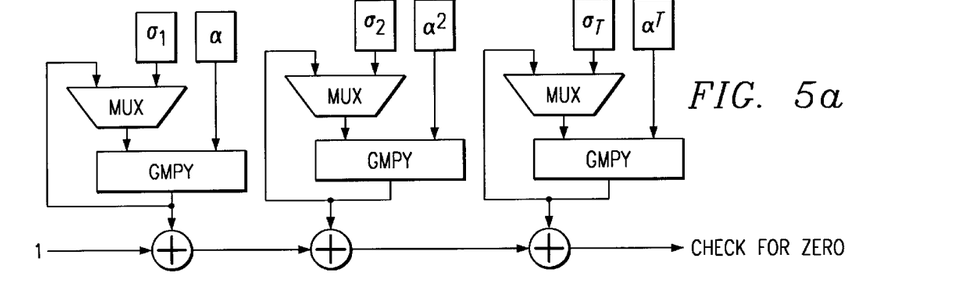

First, note that $\Lambda(\alpha^j)=1+\Lambda_1*\alpha^j+\Lambda_2*\alpha^{j2}+ \ldots +\Lambda_e*\alpha^{je}$. Thus incrementing j amounts to multiplying the mth power term, $\Lambda_m*\alpha^j$, by $\alpha^m$ to obtain $\Lambda_m*\alpha^{(j+1)m}$. The initial (j=0) mth power term is simply $\Lambda_m$. Thus a circuit as illustrated in FIG. 5a (in which the polynomial coefficients are denoted by $\sigma_m$ rather than $\Lambda_m$) evaluates the polynomial on each iteration. And if $\Lambda(\alpha^j)=0$, then $\alpha^j$ is stored in a root table.

Rather than treating the error locator polynomial as of degree e and ending the summation of terms with m=e, the error locator polynomial can be taken to have degree t=8 with the coefficients $\Lambda_m$ for m>e set equal to 0. Thus the loop summing the terms $\Lambda_m*\alpha^{jm}$ can be taken of fixed length t.

The preferred embodiments also change the search to first partition the 255 non-zero elements of GF(256) into four subsets of 64 elements each: $\{\alpha^j$ for j=0, 1, 2, ..., 63$\}$, $\{\alpha^j$ for j=64, 65, 66, ..., 127$\}$, $\{\alpha^j$ for j=128, 129, 130, ..., 191$\}$, and $\{\alpha^j$ for j=192, 193, 194, ..., 255$\}$. Note that $\alpha^{255}$ equals $\alpha^0=1$.

Figure 5B:
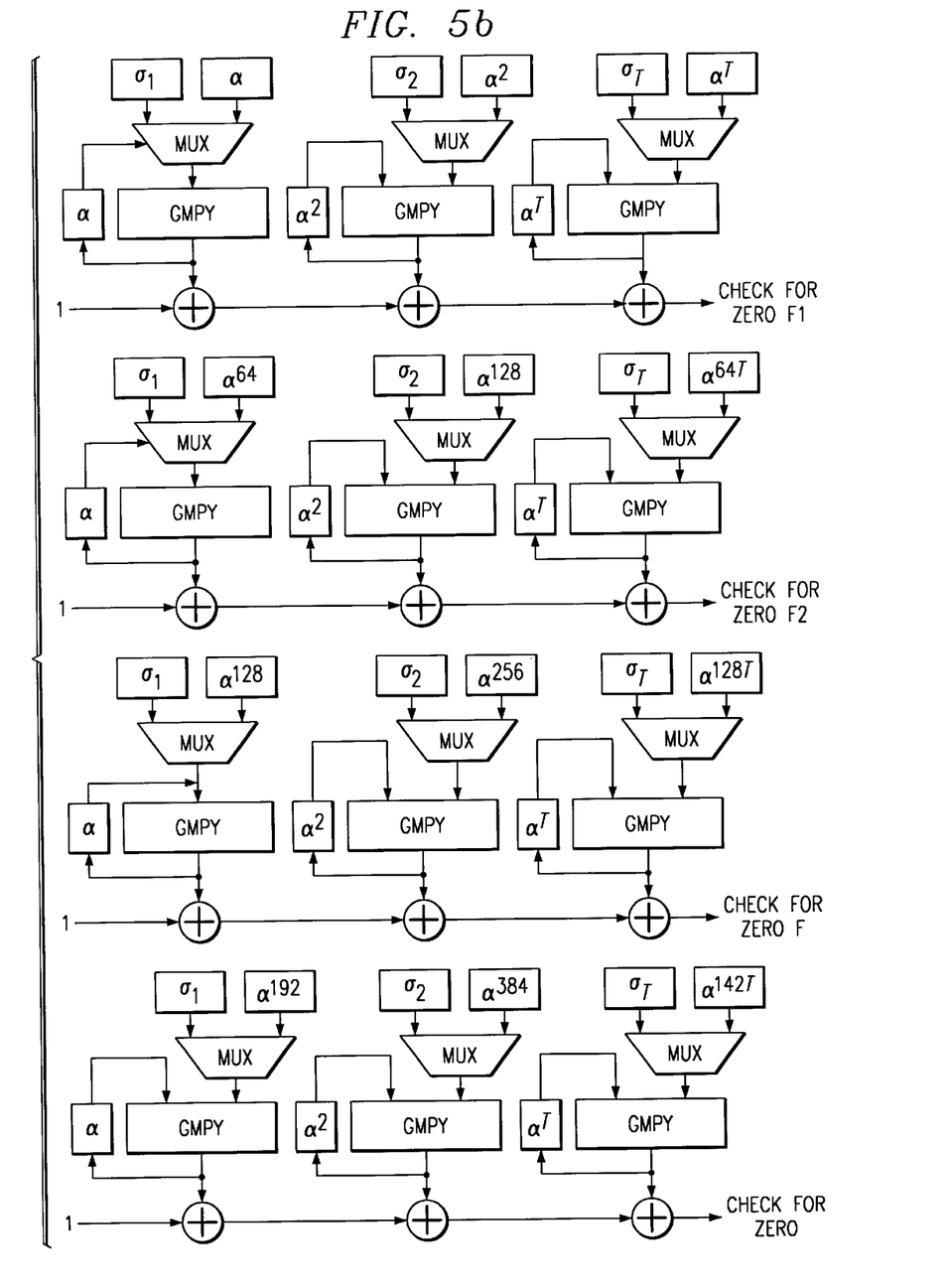
Figure 6:
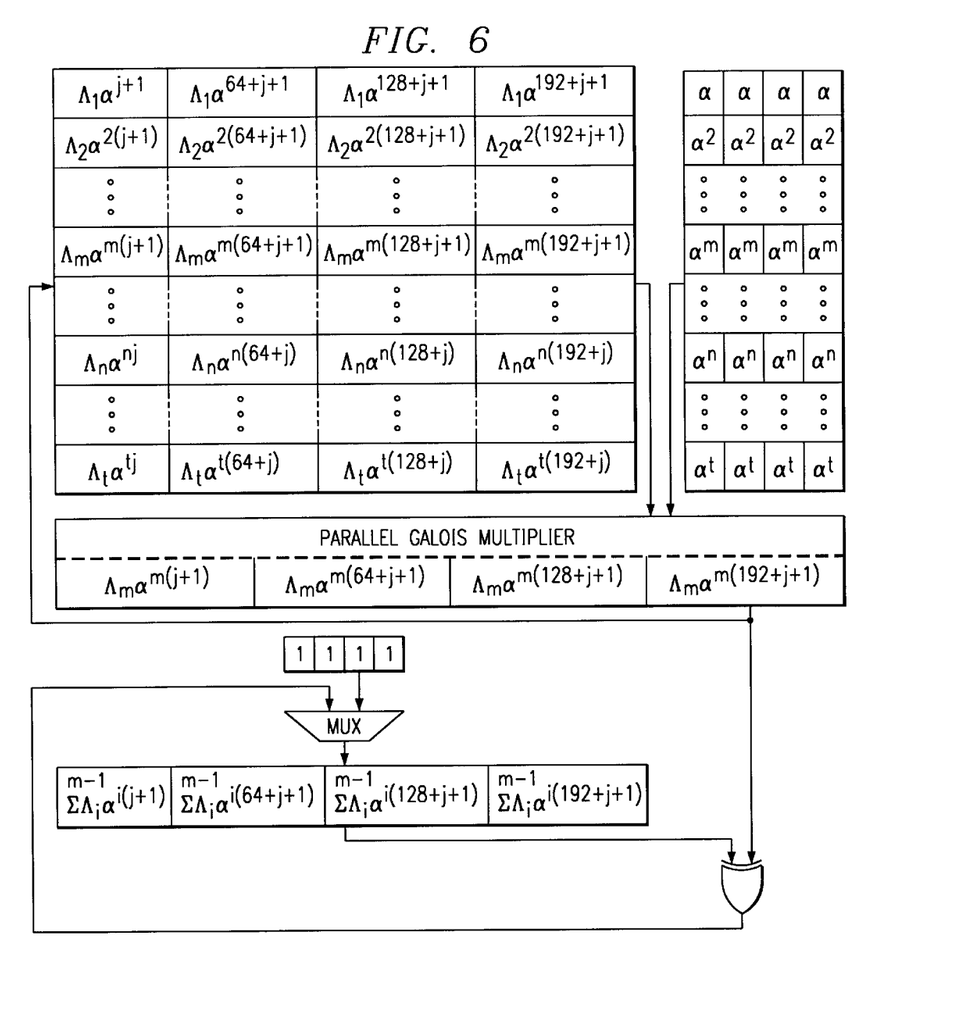

Then perform searches through the four subsets simultaneously for roots of $\Lambda(x)$ using the parallel Galois multiplier. Each of these four searches in effect is a circuit somewhat analogous to that of FIG. 5a, see FIG. 5b. The initial (j=0) mth power terms of the four searches are $\Lambda_m$, $\Lambda_m*\alpha^{64m}$, $\Lambda_m*\alpha^{128m}$, and $\Lambda_m*\alpha^{192m}$, respectively; and each increments by multiplication by $\alpha^m$ just as if the search had not been partitioned. FIG. 6 illustrates the four parallel multiplications by $\alpha^m$ in a parallel Galois multiplier and the accumulation in a register (Galois addition is bitwise XOR and is done four in parallel). After the t multiplies and accumulations, the register holds $\{\Lambda(\alpha^j), \Lambda(\alpha^{j+64}), \Lambda(\alpha^{j+128}), \Lambda(\alpha^{j+192})\}$. These four entries are checked to see which are zero and the register reset to $\{1,1,1,1\}$ and j incremented; this uses the full parallel capacity of the Galois multiplier.

Error Location Polynomial Degree

The latency of the Galois multiplier is not a problem unless the degree of the error locator polynomial is less than the latency because a product output in the jth loop is not multiplied again until the j+1 loop. In particular, see FIG. 6 which shows the $\Lambda_n*\alpha^{nj}$ terms being loaded into the Galois multiplier while the $\Lambda_m*\alpha^{m(j+1)}$ terms are being read out of the multiplier both into the accumulator for the $\Lambda(\alpha^{j+1})$ summation and back into the memory for the multiplication $\Lambda_m*\alpha^{m(j+1)}*\alpha^m$ of the j+2 iteration. Of course, the tables in FIG. 6 would be in memory, and the offset between the read pointer and write pointer matches (or exceeds) the latency of the Galois multiplier. In particular, if t=8 and a degree 8 error location polynomial (with high order coefficients possibly 0) is being used, and the Galois multiplier has latency 4, then $\Lambda_m*\alpha^{m(j+1)}$ will be in memory for 4 cycles (=8–4). In contrast, if t=4, so an degree 4 error location polynomial is being used, the product $\Lambda_m*\alpha^{m(j+1)}$ will be stored just in time for use in the j+2 iteration multiplication: $\Lambda_m*\alpha^{m(j+1)}*\alpha^m$. Thus there is no loss in using the fixed degree t polynomial instead of an actual lower degree polynomial if there are fewer than 4 errors.

Indeed, the case of t=4 can just use the case t=8 by zeroing out the high degree coefficients $\Lambda_m$ for m>4 and thereby reuse the same program as for t=8 and limit program memory.

Alternatives

In the case of a parallel Galois multiplier with P parallel multiplications, the analogous preferred embodiments partition the multiplicative subgroup of GF(256) into P subsets $\{\alpha^j \text{ for } j=0, 1, 2, \ldots, J-1\}$, $\{\alpha^j \text{ for } j=J, J+1, \ldots, 2J-1\}$, $\{\alpha^j \text{ for } j=2J, 2J+1, \ldots 3J-1\}$, et cetera, where J is the smallest integer at least as large as 255/P. (note that the last subset may generate duplications because the exponent exceeds 254). Then perform P parallel polynomial evaluations as before.

Also, the searches may decrement the index starting at j=255, 191, 127, and 63 and ending at j=192, 128, 64, and 0 with multiplications by $\alpha^{-m}$.

Or a combination of increment and decrement: start two at j=64 and decrement down plus increment up, plus start two at j=192 and increment and decrement.

Modifications

The preferred embodiments can be modified in various ways while retaining the feature of parallel Chien searches and fixed length error location polynomials with a parallel multiplier and parallel adder and scalable evaluations for use with changes in code error-correction capabilities such as t changing from 8 to 4.

For example, various Galois fields could be used; in particular, $GF(2^m)$ for m less than 8 can immediately be implemented by just using only the m lefthand bits of a symbol byte: the Galois multiplier yields a product in the same lefthand m bits for a given m by applying a corresponding mask in the partial product combinations.

Further, codes with various error-correction capabilities (e.g., t values from 1 to 8) can be handled by the same search method with use of a higher t value and just taking error locator polynomial coefficients as 0. For t larger than 8, the method can be scaled up by just increasing the length of the evaluation loops: if the Galois multiplier can handle P parallel multiplies, then partition the Galois field into P subsets and [(number of nonzero field elements)/P] loops suffice.

Of course, the same searches (with the 0 element included) can be used to find the roots of any polynomial (not just error locator polynomials) over a finite field.

What is claimed is:

1. A method of error locator polynomial evaluation, comprising:

(a) providing a Galois field multiplier with latency L cycles with L an integer greater than 1 for P parallel multiplications with P an integer greater than 1;

(b) providing a Galois field accumulator with P subsets;

(c) evaluating in parallel an error locator polynomial for each of said P subsets using said multiplier and said accumulator with the steps of:

(i) reading from a memory P elements, $\Lambda_n \alpha^{nj}, \Lambda_n \alpha^{n(j+k)}, \ldots, \Lambda_n \alpha^{n(j+k(P-1))}$, into said multiplier, where $\Lambda_n$ is the nth coefficient of said error locator polynomial, $\alpha$ is a primitive element of said Galois field, k is an integer such that kP equals the number of elements of said Galois field, and j is an integer in the range 0 to k−1;

(ii) multiplying each of said P elements of substep (i) by $\alpha^n$, (iii) accumulating the P products from substep (ii) in said accumulator;

(iv) writing said P products from substep (ii) to said memory;

(v) repeating substeps (i)–(iv) for n=0, 1, ..., t where t is at least the decree of said locator polynomial, thereby evaluating said locator polynomial for P elements $\alpha^j, \alpha^{(j+k)}, \alpha^{(j+k(P-1))}$, and (vi) repeating substep (v) for j=0, 1, ..., k−1.

2. The method of claim 1, wherein P=4 and k=64.

* * * * *